US011688958B2

(12) United States Patent
Binder et al.

(10) Patent No.: US 11,688,958 B2
(45) Date of Patent: Jun. 27, 2023

(54) ELECTRONIC ASSEMBLY THAT INCLUDES INTERCONNECTED CIRCUIT BOARDS

(71) Applicant: Microsoft Technology Licensing, LLC, Redmond, WA (US)

(72) Inventors: Julian Arlo Binder, Redwood City, CA (US); James Chester Meador, Mountain View, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 107 days.

(21) Appl. No.: 17/325,131

(22) Filed: May 19, 2021

(65) Prior Publication Data
US 2022/0376412 A1 Nov. 24, 2022

(51) Int. Cl.
| | | |
|---|---|---|
| *H01R 12/62* | (2011.01) | |
| *H01R 12/65* | (2011.01) | |
| *H05K 1/02* | (2006.01) | |
| *H05K 1/11* | (2006.01) | |
| *H05K 1/14* | (2006.01) | |
| *H05K 3/28* | (2006.01) | |
| *H05K 3/36* | (2006.01) | |

(52) U.S. Cl.
CPC ............ *H01R 12/62* (2013.01); *H01R 12/65* (2013.01); *H05K 1/0218* (2013.01); *H05K 1/118* (2013.01); *H05K 1/144* (2013.01); *H05K 3/28* (2013.01); *H05K 3/363* (2013.01); *H05K 3/365* (2013.01); *H05K 2201/10287* (2013.01); *H05K 2203/049* (2013.01); *H05K 2203/1322* (2013.01)

(58) Field of Classification Search
CPC ...... H01R 12/62; H01R 12/65; H05K 1/0218; H05K 1/118; H05K 1/144; H05K 3/28; H05K 3/363; H05K 3/365
USPC .......................................................... 361/749
See application file for complete search history.

(56) References Cited

U.S. PATENT DOCUMENTS

| | | | |
|---|---|---|---|
| 2006/0141864 A1* | 6/2006 | Suzuki ................. | B41J 2/14209 439/595 |
| 2011/0215451 A1* | 9/2011 | Yim ........................ | H01L 24/73 257/E25.027 |
| 2016/0128175 A1* | 5/2016 | Kobayashi ............. | H05K 3/361 347/50 |
| 2020/0058710 A1* | 2/2020 | Li .......................... | G06F 3/0443 |

OTHER PUBLICATIONS

"International Search Report and Written Opinion Issued in PCT Application No. PCT/US22/026424", dated Aug. 17, 2022, 10 Pages.

* cited by examiner

*Primary Examiner* — Andargie M Aychillhum
(74) *Attorney, Agent, or Firm* — Schwegman Lundberg & Woessner, P.A.

(57) ABSTRACT

An electronic assembly that includes a rigid printed circuit board having an upper surface with a first plurality of lands. The electronic assembly further includes a flexible printed circuit board having a second plurality of lands on an upper surface. The lower surface of the flexible printed circuit board is directly attached to the upper surface of the rigid printed circuit board. The electronic assembly further includes a plurality of wires. Each of the wires is bonded to the first plurality of lands on the upper surface of the rigid printed circuit board and the second plurality of lands on the upper surface of the flexible printed circuit board.

11 Claims, 5 Drawing Sheets

ELECTRONIC ASSEMBLY THAT INCLUDES INTERCONNECTED CIRCUIT BOARDS

TECHNICAL FIELD

Embodiments described herein generally relate to electrical interconnections between circuit boards.

BACKGROUND

Electronic devices have grown increasingly small and power efficient with each component within an electronic device (e.g., a smart phone, laptop, tablet, or other size dependent device) being developed in smaller sizes. Even though modern consumer electronics are utilizing small form factors, they still require significant electrical interconnect complexity in devices such as cameras, displays, sensors, and other components.

Electrical interconnection between circuit boards in such electronic devices is typically limited by the density of connectors between the printed circuit boards. Reducing the size of electrically connected printed circuit board configurations suffers from various design issues that make it difficult to fabricate an increased density of electrical interconnects between the printed circuit boards. Thus, any strategy that enables further increases in interconnect density is important.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

Printed circuit boards are typically electrically interconnected to one another using various types of connectors that tend to take up a lot of space on at least some of the circuit boards. In addition, other forms of connection that do not use connectors (e.g., ACF and hot-bar soldering) usually have low interconnect density between the circuit boards.

The electronic assemblies and methods described herein are well suited for use with a variety of electronic devices. The electronic assemblies and methods provide a robust and scalable solution for manufacturing electronic devices using various rigid printed circuit boards and flexible printed circuit boards described herein.

In addition, the configuration and arrangement of the rigid printed circuit board and the flexible printed circuit board permit the use of a smaller pitch for the electrical connections formed by wire bonds that extend between the rigid printed circuit board and the flexible printed circuit board no matter what type of electronic device eventually incorporates the electronic assemblies described herein. Using a smaller pitch for wire bonded electrical connections between the rigid printed circuit board and the flexible printed circuit board also promotes design freedom for the electronic assembly and can improve electrical performance.

Figure 1:
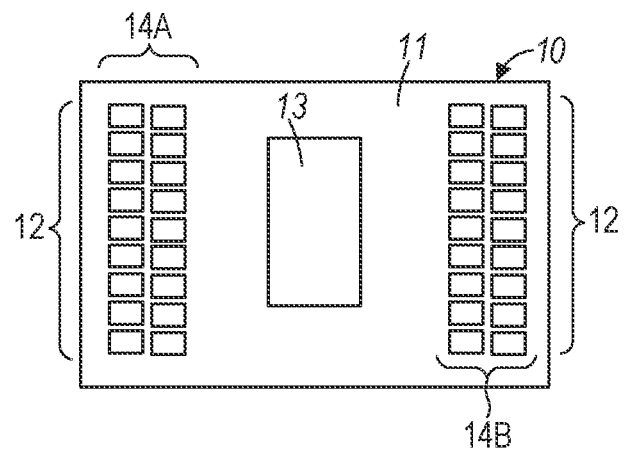
FIG. 1 shows a top view of an example rigid printed circuit board.

FIG. 1 shows a top view of a rigid printed circuit board 10. The rigid printed circuit board 10 includes an upper surface 11 having a first plurality of lands 12. As used herein, rigid printed circuit board 10 refers at least in part to a laminated stack up of (i) conductive materials (e.g., copper); (ii) rigid dielectric material (FR4); (iii) solder resist and (iv) electronic components.

Figure 2:
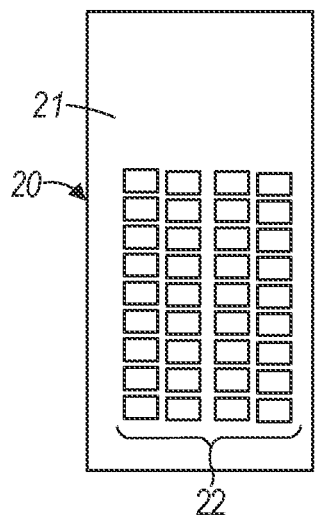
FIG. 2 shows a top view of an example flexible printed circuit board.
Figure 3:
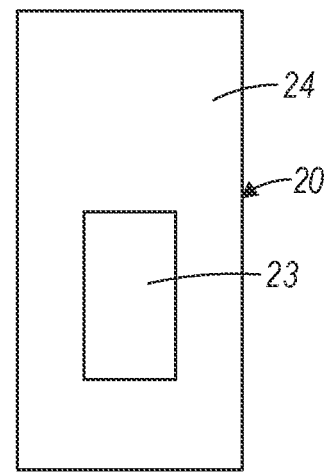
FIG. 3 shows a bottom view of the flexible printed circuit board illustrated in FIG. 2.

FIG. 2 shows a top view of an example flexible printed circuit board 20 and FIG. 3 shows a bottom view of the flexible printed circuit board 20. The flexible printed circuit board 20 includes a second plurality of lands 22 on an upper surface 21 (see FIG. 2). As used herein, flexible printed circuit board 20 refers at least in part to a laminated stack up of (i) conductive materials (e.g., copper); (ii) flexible dielectric material (e.g., polyamide); (iii) solder resist and (iv) electronic components.

Figure 4:
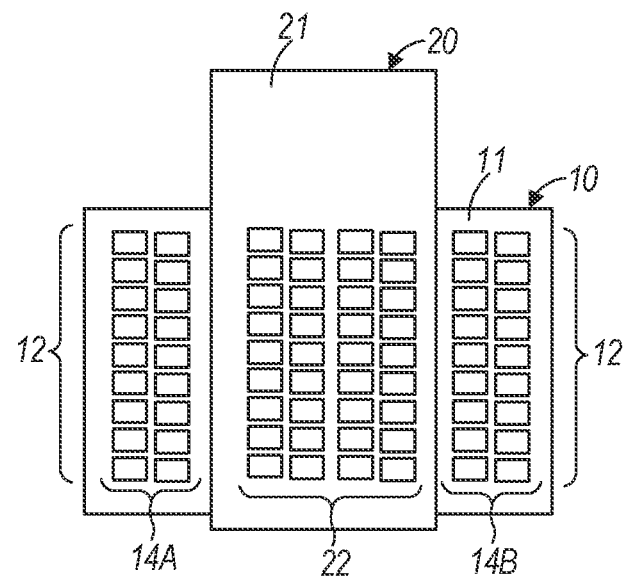
FIG. 4 shows a top view of the example rigid printed circuit board shown in FIG. 1 attached to the example flexible printed circuit board shown in FIGS. 2-3.

As shown in FIG. 4, the lower surface 24 of the flexible printed circuit board 20 is directly attached to the upper surface 11 of the rigid printed circuit board 10. The flexible printed circuit board 20 may be attached to the rigid printed circuit board 10 via an adhesive, by soldering or various other forms of attachment.

Figure 5:
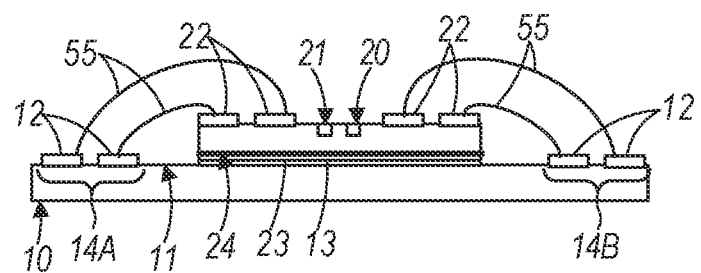
FIG. 5 shows a side view of an example electronic assembly that includes the example rigid printed circuit board attached to the example flexible printed circuit board as shown in FIG. 4.

FIG. 5 shows a side view of an example electronic assembly 50 that includes the example rigid printed circuit board 10 attached to the example flexible printed circuit board 20 as shown in FIG. 4. The electronic assembly 50 further includes a plurality of wires 55. Each of the wires 55 is wire bonded to one of the first plurality of lands 12 on the upper surface 11 of the rigid printed circuit board 10 and one of the second plurality of lands 22 on the upper surface 21 of the flexible printed circuit board 20.

As used herein, wire bonding refers at least in part to electrically connecting a relatively thin conductive wire between two electrical pads oftentimes using automated processes. The configuration and arrangement of the rigid printed circuit board 10 and the flexible printed circuit board 20 in combination with utilizing wire bonding provides more electrical interconnections between the rigid printed circuit board 10 and the flexible printed circuit board 20 to improve the performance of electrical devices that incorporate the electronic assembly 50.

In the example form of the electronic assembly 50 illustrated in FIG. 5, the upper surface 11 of rigid printed circuit board 10 includes a first ground pad 13 (see FIG. 1) and the lower surface 24 of the flexible printed circuit board 20 includes a second ground pad 23 (see FIG. 3) that is directly electrically bonded to the first ground pad 13.

In other forms of the electronic assembly 50, the first and second ground pads 13, 23 are each actually formed from several different pads that are soldered together instead of a single pad configuration. The number, size and arrangement of the first and second ground pads 13, 23 will depend in part on the mechanical and electrical configuration of an electronic device that receives the electronic assembly 50 (among other factors).

In the example form of the electronic assembly 50 shown in FIGS. 4 and 5, the first plurality of lands 12 includes a first set of lands 14A and a second set of lands 14B. The flexible printed circuit board 20 is disposed between the first set of lands 14A and the second set of lands 14B on the upper surface 11 of the rigid printed circuit board 10.

In one example, a number of lands in the first set of lands 14A is equal to a number of lands in the second set of lands 14B. It should be noted that in other forms, the first set of lands 14A and the second set of lands 14B each have a different number of lands.

The first set of lands 14A is shown as including two rows of lands and the second set of lands 14B is shown as including two rows of lands. The rows of lands run substantially parallel to each other and are spaced apart to permit improved selective wire bonding.

In addition, the second plurality of lands 22 on the upper surface 21 of the flexible printed circuit board 20 includes four rows of lands. The arrangement, number and configuration of the first plurality of lands 12 and the second plurality of lands 22 will depend in part on the (i) type and size of the rigid printed circuit board 10; (ii) type and size of the flexible printed circuit board 20; (iii) overall configuration and operation of an electronic device that includes the electronic assembly 50; and (iv) the desired interconnect density between the rigid printed circuit board 10 and the flexible printed circuit board 20 (among other factors).

Figure 6:
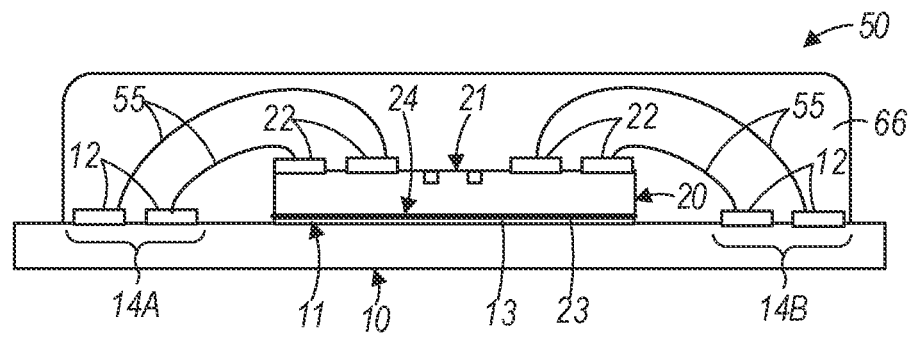
FIG. 6 shows a side view of the electronic assembly illustrated in FIG. 5 with an encapsulant covering the wire bonds.

FIG. 6 shows a side view of the electronic assembly 50 illustrated in FIG. 5. The electronic assembly 50 further includes an encapsulant 66 that covers the wires 55 in the wire bonds.

The encapsulant 66 may be formed of a polymer (although other materials are contemplated). The size and type of material that are selected for the encapsulant 66 will depend in part on the configuration and size of the first plurality of lands 12 on the upper surface 11 of the rigid printed circuit board 10 as well as the configuration and size of the second plurality of lands 22 on the upper surface 21 of the flexible printed circuit board 20.

Figure 7:
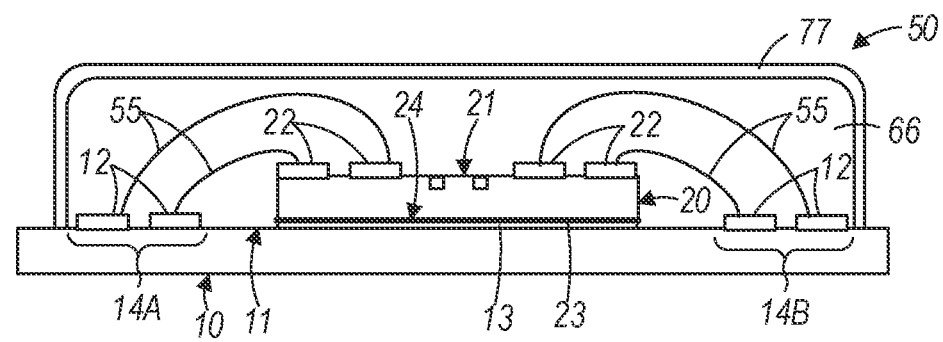
FIG. 7 shows a side view of the electronic assembly illustrated in FIG. 6 with an electromagnetic shielding material covering the encapsulant.

FIG. 7 shows a side view of the electronic assembly 50 illustrated in FIG. 6. The electronic assembly 50 further includes an electromagnetic shielding material 77 covering the encapsulant 66.

The electromagnetic shielding material 77 can include one or more of titanium, chromium, tungsten, nickel, vanadium, platinum, palladium, cobalt, silver, gold, or a combination thereof, among others. Titanium, titanium-tungsten, and/or chromium in the electromagnetic shielding material 77 can help improve adhesion to the rest of the electronic assembly 50. Silver and/or platinum in the electromagnetic shielding material 77 can help improve resistance to oxidation. The electromagnetic shielding material 77 can be coated on the electronic assembly 50 using a sputtering, spray coating, plating, paste printing, and/or roller coating process, among others.

Figure 8:
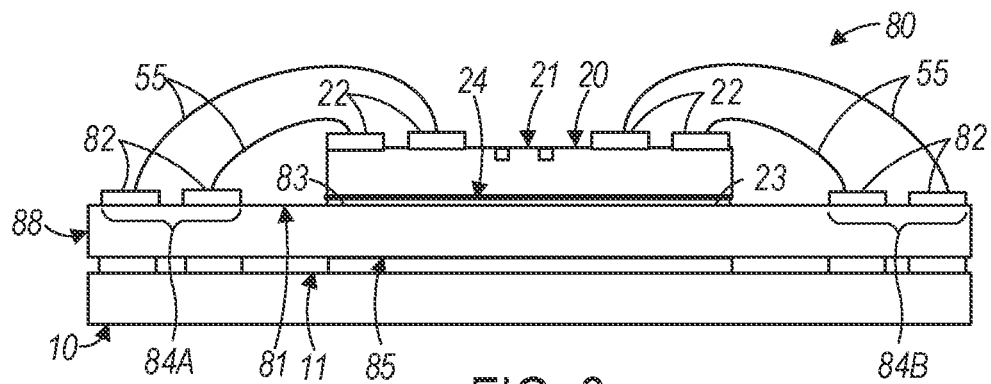
FIG. 8 shows a side view of another example electronic assembly.

FIG. 8 shows a side view of another example electronic assembly 80. The electronic assembly 80 is similar to the electronic assembly 50 with the primary difference being an interposer 88 that is included in the electronic assembly 80 and is disposed between the rigid printed circuit board 10 and the flexible printed circuit board 20.

The interposer 88 includes a lower surface 85 and an upper surface 81. The upper surface 81 of the interposer 88 includes a first plurality of lands 82.

The electronic assembly 80 further includes a flexible printed circuit board 20 that includes a second plurality of lands 22 on an upper surface 21 of the flexible printed circuit board 20. The flexible printed circuit board 20 includes a lower surface 24 that is directly attached to the upper surface 81 of the interposer 88.

The electronic assembly 80 further includes a rigid printed circuit board 10 that is directly bonded to the lower surface 85 of the interposer 88. The interposer 88 electrically connects the rigid printed circuit board 10 to the flexible printed circuit board 20.

The electronic assembly 80 further includes a plurality of wires 55. Each of the wires 55 is bonded to one of the first plurality of lands 82 on the upper surface 81 of the interposer 88 and one of the second plurality of lands 22 on the upper surface 21 of the flexible printed circuit board 20.

The interposer 88 serves as a bridge between the rigid printed circuit board 10 and the flexible printed circuit board 20. In addition, the pitch of the interconnects that are between the interposer 80 and flexible printed circuit board 20 may be smaller than the pitch in other conventional electronic assemblies.

The interposer 88 may be formed of organic polymers, fibers and conductors. The size and type of material that are selected for the interposer 88 will depend in part on the type and size of the rigid printed circuit board 10 and the type and size of the flexible printed circuit board 20 as well as the desired size and functionality of the electronic device that includes the electronic assembly 80 (among other factors).

In the example form of the electronic assembly 80 illustrated in FIG. 8, the upper surface 81 of the interposer 80 includes a first ground pad 83 and the lower surface 24 of the flexible printed circuit board 20 includes a second ground pad 23 that is directly bonded to the first ground pad 83 to form electrical connection. It should be noted that while FIG. 8 only shows a single large first ground pad 83 soldered to a single large second ground pad 23, the first and second ground pads 83, 23 may be formed in a variety of other configurations.

In other forms of the electronic assembly 80, the first and second ground pads 83, 23 are each actually formed from several different pads that are soldered together instead of a single pad configuration. The number, size and arrangement of the first and second ground pads 83, 23 will depend in part on the factors discussed above relative to electronic assembly 50.

In the example form of the electronic assembly 80 shown in FIG. 7, the first plurality of lands 82 includes a first set of lands 84A and a second set of lands 84B. The flexible printed circuit board 20 is between the first set of lands 84A and the second set of lands 84B on the upper surface 81 of the interposer 88. The arrangement, number and configuration of the first plurality of lands 82 and the second plurality of lands 22 will depend in part on the factors discussed above relative to electronic assembly 50.

The example electronic assembly 80 described herein may reduce the impact of various design issues that make it difficult to fabricate an increased density of electrical interconnects between the rigid printed circuit board 10 and the flexible printed circuit board 20. The interposer 88 provides more electrical interconnections between the rigid printed circuit board 10 and the flexible printed circuit board 20 to improve the performance of electrical devices that incorporate the electronic assembly 80.

Figure 9:
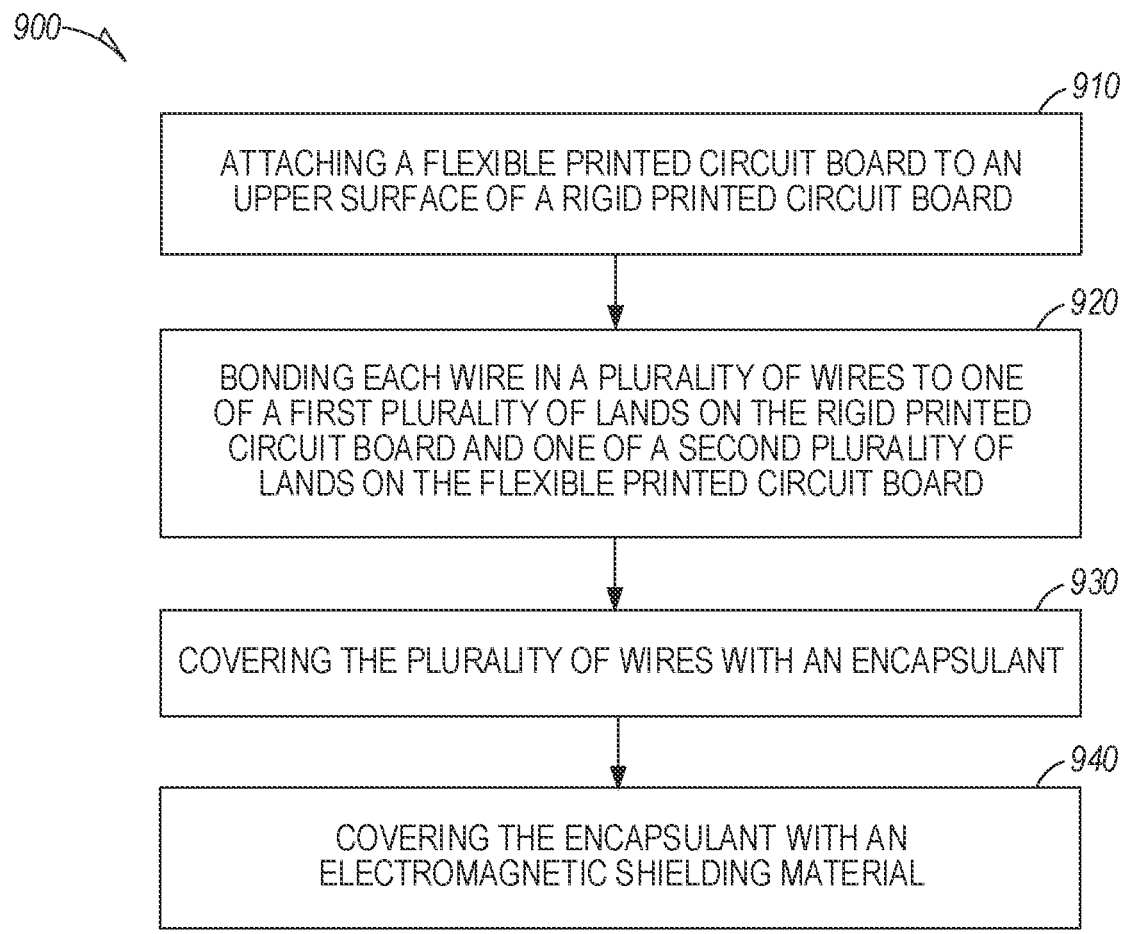
FIG. 9 is a flow diagram illustrating a method of fabricating an electronic assembly.

FIG. 9 is a flow diagram illustrating a method [900] of fabricating an electronic an electronic assembly 50. The method [900] includes [910] attaching a flexible printed circuit board 20 to an upper surface 11 of a rigid printed circuit board 20 (see FIG. 4). The flexible printed circuit board 20 may be attached to the rigid printed circuit board 10 via an adhesive, by soldering or various other forms of attachment.

The method [900] further includes [920] bonding each wire in a plurality of wires 55 to one of a first plurality of lands 12 on the rigid printed circuit board 10 and one of a second plurality of lands 22 on the flexible printed circuit board 10 via wire bonding techniques (see FIG. 5). The number, size and arrangement of the wire bonds will depend in part on the type and size of the rigid printed circuit board 10 and the flexible printed circuit board 20 as well as the configuration of the electronic device that eventually receives the electronic assembly 50 (among other factors).

In some forms of the method [900], [910] attaching a flexible printed circuit board 20 to a rigid printed circuit board 10 includes attaching a first ground pad 13 on an upper surface 11 of the rigid printed circuit board 10 to a second ground pad on a lower surface 24 of the flexible printed circuit board 20 (e.g., by soldering).

In the example form illustrated in FIGS. 4 and 5, [910] attaching a flexible printed circuit board 10 to a rigid printed circuit board 20 includes attaching the flexible printed circuit board 20 between a first set of lands 14A in the first plurality of lands 12 and a second set of lands 14B in the first plurality of lands 12 on the upper surface 11 of the rigid printed circuit board 10.

In some forms, [920] bonding each wire in a plurality of wires 55 to one of a first plurality of lands 12 on the rigid printed circuit board 10 includes bonding the wires 55 to the first set of lands 14A located on one side of the flexible printed circuit board 20 and the second set of lands 14B located on an opposing side of the flexible printed circuit board 20. In other forms, the first and second set of lands 14A. 14B may be on one side, or adjacent sides, of the flexible printed circuit board 20.

As shown in FIGS. 4 and 5, bonding each of the wires 55 to the first set of lands 14A on one side of the flexible printed circuit board 20 can include bonding the wires 55 to two rows of lands. In addition, bonding each of the wires 55 to the second set of lands 14B on the opposing side of the flexible printed circuit board 20 can include bonding the wires 55 to two rows of lands.

As shown in FIGS. 6 and 9, the method [900] may further include [930] covering the plurality of wires 55 with an encapsulant 66. As discussed above, the encapsulant 66 may be formed of a polymer (although other materials are contemplated).

As shown in FIGS. 7 and 9, the method [900] may further include [940] covering the encapsulant 66 with an electromagnetic shielding material 77 after attachment. As discussed above, the electromagnetic shielding material 77 can be formed of a variety of materials depending on desired characteristics of the electromagnetic shielding material 77. In addition, the electromagnetic shielding material 77 can be coated on the electronic assembly 50 using a sputtering, spray coating, plating, paste printing, and/or roller coating process, among others.

The methods [900] described herein improve on the conventional methods of fabricating electronic assemblies that include flexible and rigid circuit boards. The attachment of the rigid printed circuit board 10 to the flexible printed circuit board 20 in the configuration and arrangement as described herein are beneficial because they permit a higher interconnect density between the rigid printed circuit board 10 and the flexible printed circuit board 20.

Figure 10:
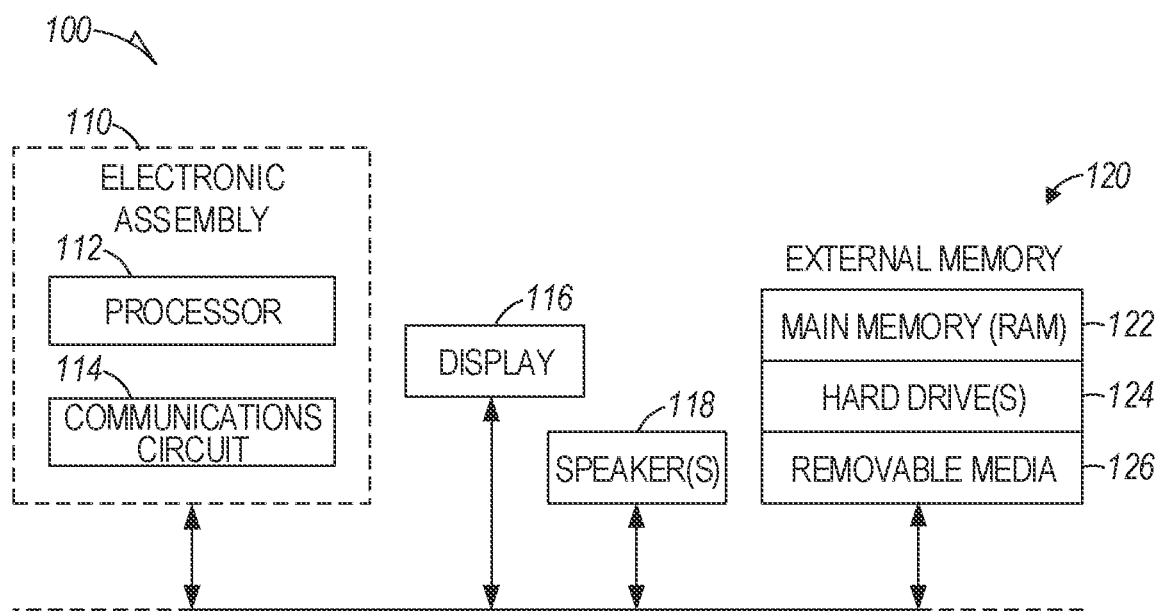
FIG. 10 is block diagram of an electronic device that includes the electronic assemblies and/or methods described herein.

FIG. 10 is a block diagram of an electronic device 100 incorporating at least one of the electronic assemblies 50, 80 and/or method [900] described herein. Electronic device 100 is merely one example of an electronic device in which forms of the electronic assemblies 50, 80 and/or methods [900] described herein may be used.

Examples of an electronic device 100 include, but are not limited to, personal computers, tablet computers, mobile telephones, game devices. MP3 or other digital music players, etc. In this example, electronic device 100 comprises a data processing system that includes a system bus 102 to couple the various components of the electronic device 100. System bus 102 provides communications links among the various components of the electronic device 100 and may be implemented as a single bus, as a combination of busses, or in any other suitable manner.

An electronic assembly 110 similar to the electronic assemblies 50, 80 described herein may be coupled to system bus 102. The electronic assembly 110 may include any circuit or combination of circuits. In one embodiment, the electronic assembly 110 includes a processor 112 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic assembly 110 are a custom circuit, an application-specific integrated circuit (ASIC), or the like, such as, for example, one or more circuits (such as a communications circuit 114) for use in wireless devices like mobile telephones, tablet computers, laptop computers, two-way radios, and similar electronic systems. The IC can perform any other type of function.

The electronic device 100 may also include an external memory 120, which in turn may include one or more memory elements suitable to the particular application, such as a main memory 122 in the form of random access memory (RAM), one or more hard drives 124, and/or one or more drives that handle removable media 126 such as compact disks (CD), flash memory cards, digital video disk (DVD), and the like.

The electronic device 100 may also include a display device 116, one or more speakers 118, and a keyboard and/or controller 130, which can include a mouse, trackball, touch screen, voice-recognition device, or any other device that permits a system user to input information into and receive information from the electronic device 100.

To better illustrate the electronic assemblies 50, 80, methods [900] and/or the electronic device 100 disclosed herein, a non-limiting list of examples is provided here.

Example 1 is an electronic assembly that includes a rigid printed circuit board having an upper surface with a first plurality of lands; a flexible printed circuit board that includes a second plurality of lands on an upper surface, wherein a lower surface of the flexible printed circuit board is directly attached to the upper surface of the rigid printed circuit board; and a plurality of wires, each of the wires being bonded to one of the first plurality of lands on the upper surface of the rigid printed circuit board and one of the second plurality of lands on the upper surface of the flexible printed circuit board.

Example 2 includes the electronic assembly of example 1, wherein the upper surface of the rigid printed circuit board includes a first ground pad, and the lower surface of the flexible printed circuit board includes a second ground pad that is directly electrically bonded to the first ground pad.

Example 3 includes the electronic assembly of any one of examples 1-2, wherein the first plurality of lands includes a first set of lands and a second set of lands such that the flexible printed circuit board is disposed between the first set of lands and the second set of lands on the upper surface of the rigid printed circuit board.

Example 4 includes the electronic assembly of any one of examples 1-3, wherein a number of lands in the first set of lands is equal to a number of lands in the second set of lands.

Example 5 includes the electronic assembly of any one of examples 1-4, wherein the first set of lands includes two rows of lands and the second set of lands includes two rows of lands.

Example 6 includes the electronic assembly of examples 1-5, wherein the second plurality of lands includes four rows of lands.

Example 7 includes the electronic assembly of any one of examples 1-6, and further including an encapsulant that covers the plurality of wires.

Example 8 includes the electronic assembly of any one of examples 1-7, wherein the encapsulant covers the first plurality of lands and the second plurality of lands.

Example 9 includes the electronic assembly of any one of examples 1-8, and further including an electromagnetic shielding material that covers the encapsulant.

Example 10 is an electronic assembly that includes an interposer having a lower surface and an upper surface, the upper surface of the interposer having a first plurality of lands; a flexible printed circuit board that includes a second plurality of lands on an upper surface, wherein the flexible printed circuit board includes a lower surface that is directly attached to the upper surface of the interposer; a rigid printed circuit board directly electrically bonded to the lower surface of the interposer such that the interposer electrically connects the rigid printed circuit board to the flexible printed circuit board; and a plurality of wires, each of the wires being bonded to one of the first plurality of lands on the upper surface of the interposer and one of the second plurality of lands on the upper surface of the flexible printed circuit board.

Example 11 includes the electronic assembly of example 10, wherein the upper surface of interposer includes a first ground pad, and the lower surface of the flexible printed circuit board includes a second ground pad that is directly electrically bonded to the first ground pad.

Example 12 includes the electronic assembly of any one of examples 10-11, and wherein the first plurality of lands includes a first set of lands and a second set of lands such that the flexible printed circuit board is disposed between the first set of lands and the second set of lands on the upper surface of the interposer.

Example 13 includes the electronic assembly of anyone of examples 10-12, and further including an encapsulant that covers the plurality of wires; and an electromagnetic shielding material that covers the encapsulant.

Example 14 is a method of fabricating an electronic assembly. The method includes attaching a flexible printed circuit board to an upper surface of a rigid printed circuit board. The method further includes bonding each wire in a plurality of wires to one of a first plurality of lands on the rigid printed circuit board and one of a second plurality of lands on the flexible printed circuit board.

Example 15 includes the method of example 14, wherein attaching a flexible printed circuit board to an upper surface of a rigid printed circuit board includes attaching a first ground pad on an upper surface of the rigid printed circuit board to a second ground pad on a lower surface of the flexible printed circuit board.

Example 16 includes the method of any one of examples 14-15, wherein attaching a flexible printed circuit board to an upper surface of a rigid printed circuit board includes attaching the flexible printed circuit board to the upper surface of the rigid printed circuit board such that the flexible printed circuit board is disposed between a first set of lands in the first plurality of lands and a second set of lands in the first plurality of lands Example 17 includes the method of any one of examples 14-16, wherein bonding each wire in a plurality of wires to one of a first plurality of lands on the rigid printed circuit board includes bonding the wires to one of the first set of lands located on one side of the flexible printed circuit board and to one of the second set of lands located on an opposing side of the flexible printed circuit board.

Example 18 includes the method of any one of examples 14-17, wherein bonding the wires to one of the first set of lands on one side of the flexible printed circuit board includes bonding the wires to two rows of lands, and wherein bonding the wires to one of the second set of lands on the opposing side of the flexible printed circuit board includes bonding the wires to two rows of lands.

Example 19 includes the method of any one of examples 14-18, wherein the method further includes covering the plurality of wires with an encapsulant.

Example 20 includes the method of any one of examples 14-19, wherein the method further includes covering the encapsulant with an electromagnetic shielding material.

These and other examples and features of the present electronic assemblies and electronic packages will be set forth in part in the detailed description.

This overview is intended to provide non-limiting examples of the present subject matter. It is not intended to provide an exclusive or exhaustive explanation. The detailed description is included to provide further information about the methods [800], electronic assemblies 30 and/or electronic packages 10 described herein.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B." unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description.

The Abstract is provided to comply with 37 C.F.R. § 1.72(b), to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An electronic assembly comprising:
a rigid printed circuit board that includes an upper surface having a first plurality of lands;
a flexible printed circuit board that includes a second plurality of lands on an upper surface, wherein a lower surface of the flexible printed circuit board is directly attached to the upper surface of the rigid printed circuit board, wherein the upper surface of the rigid printed circuit board includes a first ground pad, and the lower surface of the flexible printed circuit board includes a second ground pad that is directly electrically bonded to the first ground pad; and
a plurality of wires, each of the wires being bonded to one of the first plurality of lands on the upper surface of the rigid printed circuit board and one of the second plurality of lands on the upper surface of the flexible printed circuit board.

2. The electronic assembly of claim 1, further comprising an encapsulant that covers the plurality of wires.

3. The electronic assembly of claim 2, wherein the encapsulant covers the first plurality of lands and the second plurality of lands.

4. The electronic assembly of claim 2, further comprising an electromagnetic shielding material that covers the encapsulant.

5. An electronic assembly comprising:
a rigid printed circuit board that includes an upper surface having a first plurality of lands;
a flexible printed circuit board that includes a second plurality of lands on an upper surface, wherein a lower surface of the flexible printed circuit board is directly attached to the upper surface of the rigid printed circuit board, wherein the first plurality of lands includes a first set of lands and a second set of lands such that the flexible printed circuit board is disposed between the first set of lands and the second set of lands on the upper surface of the rigid printed circuit board; and
a plurality of wires, each of the wires being bonded to one of the first plurality of lands on the upper surface of the rigid printed circuit board and one of the second plurality of lands on the upper surface of the flexible printed circuit board.

6. The electronic assembly of claim 5, wherein a number of lands in the first set of lands is equal to a number of lands in the second set of lands.

7. The electronic assembly of claim 5, wherein the first set of lands includes two rows of lands and the second set of lands includes two rows of lands.

8. The electronic assembly of claim 7, wherein the second plurality of lands includes four rows of lands.

9. An electronic assembly, comprising:
an interposer that includes a lower surface and an upper surface, the upper surface of the interposer having a first plurality of lands;
a flexible printed circuit board that includes a second plurality of lands on an upper surface, wherein the flexible printed circuit board includes a lower surface that is directly attached to the upper surface of the interposer;
a rigid printed circuit board directly electrically bonded to the lower surface of the interposer such that the interposer electrically connects the rigid printed circuit board to the flexible printed circuit board, wherein the upper surface of interposer includes a first ground pad, and the lower surface of the flexible printed circuit board includes a second ground pad that is directly electrically-bonded to the first ground pad; and
a plurality of wires, each of the wires being bonded to one of the first plurality of lands on the upper surface of the interposer and one of the second plurality of lands on the upper surface of the flexible printed circuit board.

10. The electronic assembly of claim 9, further comprising:
an encapsulant that covers the plurality of wires; and
an electromagnetic shielding material that covers the encapsulant.

11. An electronic assembly, comprising:
an interposer that includes a lower surface and an upper surface, the upper surface of the interposer having a first plurality of lands;
a flexible printed circuit board that includes a second plurality of lands on an upper surface, wherein the flexible printed circuit board includes a lower surface that is directly attached to the upper surface of the interposer;

a rigid printed circuit board directly electrically bonded to the lower surface of the interposer such that the interposer electrically connects the rigid printed circuit board to the flexible printed circuit board, wherein the first plurality of lands includes a first set of lands and a second set of lands such that the flexible printed circuit board is disposed between the first set of lands and the second set of lands on the upper surface of the interposer; and a plurality of wires, each of the wires being bonded to one of the first plurality of lands on the upper surface of the interposer and one of the second plurality of lands on the upper surface of the flexible printed circuit board.

\* \* \* \* \*